United States Patent
Pere-Laperne et al.

(10) Patent No.: US 12,514,022 B2
(45) Date of Patent: Dec. 30, 2025

(54) METHOD FOR FABRICATING A PHOTODIODE STRUCTURE AND PHOTODIODE STRUCTURE

(71) Applicant: LYNRED, Palaiseau (FR)

(72) Inventors: Nicolas Pere-Laperne, Grenoble (FR); Alexandre Kerlain, Grenoble (FR); Vincent Destefanis, Claix (FR); Paul Fougeres, Veurey-Voroize (FR)

(73) Assignee: LYNRED, Palaiseau (FR)

( * ) Notice: Subject to any disclaimer, the term of this patent is extended or adjusted under 35 U.S.C. 154(b) by 392 days.

(21) Appl. No.: 18/270,126

(22) PCT Filed: Dec. 30, 2021

(86) PCT No.: PCT/EP2021/087850
§ 371 (c)(1),
(2) Date: Jun. 28, 2023

(87) PCT Pub. No.: WO2022/144419
PCT Pub. Date: Jul. 7, 2022

(65) Prior Publication Data
US 2024/0072183 A1 Feb. 29, 2024

(30) Foreign Application Priority Data
Dec. 31, 2020 (FR) ........................... 2014308

(51) Int. Cl.
*H10F 77/123* (2025.01)
*H10F 30/221* (2025.01)
(Continued)

(52) U.S. Cl.
CPC ..... *H10F 77/1237* (2025.01); *H10F 30/2212* (2025.01); *H10F 30/223* (2025.01);
(Continued)

(58) Field of Classification Search
CPC ............ H10F 77/1237; H10F 71/1253; H10F 77/148; H10F 30/2212; H10F 77/1233; H10F 30/223; H10F 71/00
See application file for complete search history.

(56) References Cited

U.S. PATENT DOCUMENTS 3,902,924 A 9/1975 Maciolek et al.
4,376,663 A 3/1983 Wang et al.
(Continued)

FOREIGN PATENT DOCUMENTS

WO 98/15016 A1 4/1998

OTHER PUBLICATIONS

Martyniuk et al.; "Utmost response time of long-wave HgCdTe photodetectors operating under zero voltage condition;" Opt Quant Electron; 2018; pp. 49-50; vol. 50, No. 17.
(Continued)

*Primary Examiner* — David Vu
*Assistant Examiner* — Brandon C Fox
(74) *Attorney, Agent, or Firm* — Oliff PLC

(57) ABSTRACT

A substrate to fabricate a photodiode structure has a top layer made from cadmium-doped semiconductor material. A first HgCdTe-base layer is formed by liquid phase epitaxy from the top layer with a bath containing an n-type electrically active dopant to electrically dope the first layer. The cadmium diffuses from the top layer to the first layer to form a decreasing cadmium concentration gradient from the interface with the top layer in a direction away from the interface. The cadmium concentration gradient causes a decreasing band gap width gradient in the first layer from the interface and causes an n-type dopant concentration gradient in the first layer from the interface.

11 Claims, 1 Drawing Sheet

(51) Int. Cl.
    *H10F 30/223*    (2025.01)
    *H10F 71/00*     (2025.01)
    *H10F 77/00*     (2025.01)
    *H10F 77/14*     (2025.01)

(52) U.S. Cl.
    CPC ......... *H10F 71/00* (2025.01); *H10F 71/1253* (2025.01); *H10F 77/1233* (2025.01); *H10F 77/148* (2025.01)

(56) References Cited

U.S. PATENT DOCUMENTS

| | | | |
|---|---|---|---|
| 5,846,850 | A | 12/1998 | Dreiske et al. |
| 5,861,321 | A | 1/1999 | Tregilgas et al. |
| 5,998,809 | A | 12/1999 | Chen et al. |
| 2014/0217540 | A1 | 8/2014 | Tennant et al. |
| 2015/0303322 | A1* | 10/2015 | Mollard ............. H10F 30/2212 257/443 |
| 2017/0309663 | A1* | 10/2017 | Rothman ............. H10F 30/2212 |
| 2023/0072648 | A1* | 3/2023 | Boieriu ............. H10F 77/1237 |
| 2023/0155043 | A1* | 5/2023 | Boulard ............. H10F 77/1237 257/442 |

OTHER PUBLICATIONS

Piotrowski et al.; Dark Currents, responsivity, and response time in graded gap HgCdTe structures; Proc of SPIE; 2010; pp. 1-8; vol. 7660.

Jaime-Vasquez et al.; "Plasma-Cleaned InSb (112)B for Large-Area Epitaxy of HgCdTe Sensors;" Journal of Electronic Materials; 2008; pp. 1247-1254; vol. 37, No. 9.

Tower et al.; "Trace Copper Measurements and Electrical Effects in LPE HgCdTe;" Journal of Electronic Materials; 1996; pp. 1183-1187; vol. 25, No. 8.

Mar. 24, 2022 Search Report issued in International Patent Application No. PCT/EP2021/087850.

* cited by examiner

METHOD FOR FABRICATING A PHOTODIODE STRUCTURE AND PHOTODIODE STRUCTURE

BACKGROUND OF THE INVENTION

The invention relates to a method for fabricating a photodiode structure and more generally to an optoelectronic device.

STATE OF THE ART

In a large number of technical fields, photodetectors are known that provide an electrical signal representative of an observed scene. Photodetectors in particular exist that are configured to specifically capture an infrared signal that can be used in night vision devices or in numerous other fields of activity where a large part of the signal to be studied is located in the infrared range.

It is for example known to fabricate infrared detectors from semiconductor materials that are alloys of HgCdTe or MCT standing for Mercury Cadmium Telluride. These materials are particularly attractive as they have a direct gap associated with a high band gap energy value that is adjustable according to the cadmium composition. These materials are produced by epitaxy from a substrate that acts as support and that is generally transparent in the studied wavelength range.

It is particularly advantageous to use photodetectors in the form of photodiodes and more particularly in the form of a p-n or p-i-n junction. The electromagnetic radiation that passes through the photodiode with a higher energy than the band gap value is captured and transformed into an electron-hole pair. The electrical charges are collected to be processed as a signal representative of the observed scene.

Different photodiode architectures are used to capture infrared radiation and the multiple differences that exist between these architectures seek to improve their operation, for example the signal-to-noise ratio.

A photodiode configuration is presented in the document US 2014/0217540 that describes a stack successively comprising, starting from the substrate, a passivating buffer layer of a first conductivity type, an active layer of the first conductivity type or undoped, a covering layer, a second passivating layer and a junction layer of second conductivity type to form a p-n junction with the active layer and the second passivating layer.

The document U.S. Pat. No. 4,376,663 describes the formation of a HgCdTe layer by liquid phase epitaxy on a CdTe substrate. The substrate can be undoped to form a layer of p-doped HgCdTe or the substrate can be doped with indium to form an n-doped HgCdTe layer by diffusion of the indium atoms when epitaxial growth takes place. It is also possible to form an n-doped HgCdTe layer by diffusion of a gaseous atmosphere. The HgCdTe layer has a thickness comprised between 20 and 30 micrometers or even equal to 40 micrometers. A CdTe layer is deposited by epitaxy on the HgCdTe layer and has a thickness comprised between 5 and 10 micrometers.

The publication by Martyniuk et al ("Utmost response time of long-wave HgCdTe photodetectors operating under zero voltage condition") discloses an infrared detector formed by several layers of HgCdTe to define a structure of npn type the central absorbent layer of which is p+ doped with an electrical acceptor concentration equal to $10^{17}*cm^{-3}$. The structure has a decreasing cadmium concentration between the layer receiving the incident radiation ($X_{Cd}=0.25$) and the absorbent layer ($X_{Cd}=0.19$) and a decreasing cadmium composition gradient from the other end of the absorbent layer in the direction of the contact layer. The contact layer has an opposite conductivity to that of the absorbent layer and is formed by an increasing concentration gradient to revert to the cadmium concentration of the absorbent layer. The photodetector has a highly-doped absorbent layer so as to be able to operate at high frequency.

OBJECT OF THE INVENTION

One object of the invention is to provide a method for fabricating a photodiode structure that is easy to implement while at the same time ensuring a better channeling of the photogenerated carriers.

This object tends to be achieved by means of a method for fabricating a photodiode structure successively comprising:
  providing a substrate having at least a top layer made from CdZnTe or CdTe and having a first concentration of a first electrical dopant of a first conductivity type and a first cadmium concentration, the top layer being of the first conductivity type,
  growing a first layer of HgCdTe or one of its at least quaternary derivatives from the top layer by liquid phase epitaxy using a single bath containing the precursors of the first layer including cadmium and possibly at least one electrical dopant, the bath having a second cadmium concentration that is lower than the first cadmium concentration and possibly a second electrical dopant concentration that is lower than the first concentration of the first electrical dopant, the at least one electrical dopant being chosen from the first electrical dopant and/or a second electrical dopant, the liquid phase epitaxy being performed at a temperature achieving diffusion of a part of the cadmium atoms and of the first electrical dopant from the top layer to the first layer to form a first cadmium concentration gradient that decreases continuously from the interface between the top layer and the first layer in a direction away from the interface, the minimum atomic concentration value of cadmium in the first concentration gradient being comprised between 10% and 25% atomic, and to form a second concentration gradient of the at least one electrical dopant in the first layer, the second concentration gradient being decreasing, the first layer being of first conductivity type, the thickness of the first layer being less than 6 microns,
  forming at least one junction layer made from a second semiconductor material doped with a second conductivity type to form a pn or pin junction with the first layer, the first cadmium concentration gradient and the second concentration gradient of the first electrical dopant being preserved in the first layer after formation of the junction layer.

In one development, the thickness of the first layer is greater than or equal to 3 microns and preferentially less than or equal to 5 microns, after formation of the second layer.

In a particular embodiment, the first concentration gradient extends in the first layer until the cadmium concentration is constant over a distance comprised between 500 nm and 1.5 microns from the interface.

In advantageous manner, the cadmium concentration difference in the first concentration gradient is at least equal to 10% atomic and preferentially at least equal to 25% atomic.

It is advantageous to provide for the second concentration gradient to extend in the first layer over a distance comprised between 500 nm and 1.5 microns from the interface and until the first electrical dopant concentration is less than $2*10^{15}$ at/cm$^3$.

It is further advantageous to provide for the first dopant concentration in the top layer to be comprised between $5*10^{15}$ and $1*10^{19}$ at/cm$^3$ before the liquid phase epitaxy deposition step.

In a preferred embodiment, the first electrical dopant concentration gradient in the first layer decreases from a concentration of more than $5*10^{18}$ at/cm$^3$ to a concentration of less than $2*10^{15}$ at/cm$^3$.

Advantageously, the total thickness of the first layer and the junction layer is less than 6 microns, preferably less than 5 microns.

In a particular configuration, the substrate is at least partially or totally removed after formation of an electrically conductive contact on the second layer.

Preferentially, the first electrical dopant is iodine and the second concentration gradient of iodine decreases continuously from the interface between the top layer and the first layer in a direction away from the interface.

It is a further object of the invention to provide a photodiode structure that presents better performances than the prior art configurations while achieving a better control of channeling of the photogenerated charge carriers.

The photodiode structure successively comprises:
- a first layer of HgCdTe or one of its at least quaternary derivatives, the first layer comprising a first cadmium concentration gradient that decreases continuously from the interface between the top layer and the first layer a direction away from the interface, the minimum atomic concentration value of cadmium in the first concentration gradient being comprised between 10% and 25% atomic, a second concentration gradient of at least one electrical dopant in the first layer, the second concentration gradient being decreasing, the first layer being of the first conductivity type, the thickness of the first layer being less than 6 microns,
- a second layer of HgCdTe or one of its at least quaternary derivatives, the second layer being a layer of a second conductivity type opposite from the first conductivity type, the first and second layers forming a junction performing transformation of an electromagnetic signal into electron-hole pairs, the second layer having at least the same Hg, Cd and Te composition as the first layer at the interface between the first layer and the second layer.

BRIEF DESCRIPTION OF THE DRAWINGS

Other advantages and features will become more clearly apparent from the following description of particular embodiments and implementation modes of the invention given for non-restrictive example purposes only and represented in the accompanying drawings, in which.

DESCRIPTION OF THE EMBODIMENTS

Figure 1:
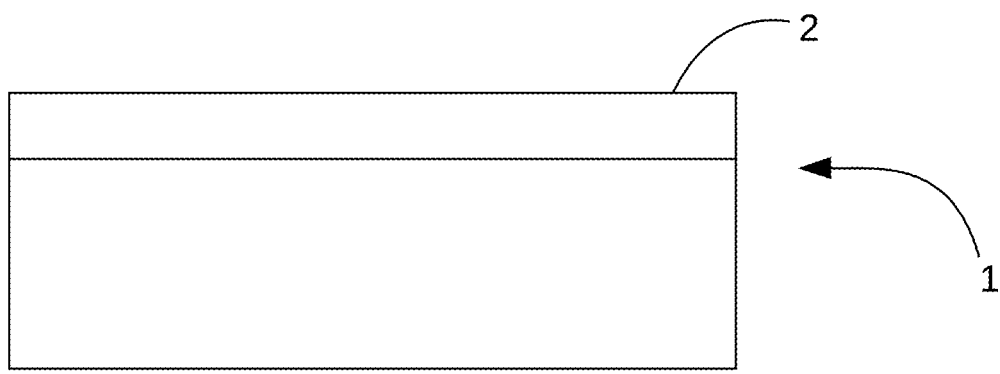
FIG. 1 schematically represents a first step of a method for fabricating a photodiode structure according to the invention, in cross-section.

To perform detection of an electromagnetic radiation in the infrared range, it is preferable to use a photodiode that is a pn diode or a pin diode to transform the collected electromagnetic signal into an electrical signal. The photodiode has a junction formed by a layer of n-type conductivity and a layer of p-type conductivity.

The pn diode is formed by a first layer of n-type doped semiconductor material and a second layer of p-type doped semiconductor material. The two layers of semiconductor material are in direct contact and define an interface.

The pin diode is formed by a first layer of n-type doped semiconductor material, a second layer of p-type doped semiconductor material, a third layer of semiconductor material that is unintentionally doped or that has an extrinsic doping close to the doping value of the unintentionally doped semi-conductor material layer. The third layer separates and has an interface with respectively the first layer and the second layer of n-type or p-type doped semiconductor materials.

Other more complex structures with one or more doped or undoped passivation layers can be used and inserted between the first layer of n-type doped semiconductor material and the second layer of p-type doped semiconductor material in so far as these two layers form a junction. Formation of a junction ensures the creation of a depletion area in the photodiode. The depletion area extends partly in the p-type doped layer and in the n-type doped layer. Unlike the structure disclosed by Martyniuk, the photodetector only has a single pn or pin junction. In other words, the photodetector is not an npn or pnp structure. The photodetector is structurally different and its charge carrier collection mode is different which means that the operating mode of the photodetector is different.

To capture an infrared radiation, it is possible to use a photodiode made from a semiconductor material of low band gap value in the infrared range, for example a material whose general composition is represented by the formula HgCdTe. The band gap value changes according to the composition of the alloy which enables the wavelength range collected by the diode to be adjusted. For a HgCdTe based alloy, the band gap value changes with the cadmium concentration and with the mercury concentration. A layer made from HgCdTe material is a layer the main constituents of which are Hg, Cd and Te. The precise composition of each of the constituents is not defined unless specified otherwise.

To produce a photodiode presenting good performances and preferably a multitude of photodiodes presenting good performances, it is advantageous to form the photodiode on a substrate and more particularly to form at least one active layer of the photodiode by a liquid phase epitaxy step.

In a particular configuration, a first layer of n-doped semiconductor material is formed on a substrate before a p-doped second layer is formed. In another configuration, a p-doped first layer is formed on the substrate before an n-doped second layer is formed.

To obtain a good channeling of the photogenerated charge carriers, it is advantageous to form a photodiode in which there exists an electrical doping gradient within the first layer of n-doped semiconductor material and/or within the first layer of p-doped semiconductor material. The same is advantageously the case in the second layer of semiconductor material. However, as the electrical doping level has an influence on the optical detection and on the electro-optical performances (in particular the dark current), it is advantageous to provide for the electrical doping gradient to be associated with a band width gradient so that the highest electrically doped areas are less electro-optically active.

When the n-doped semiconductor material layer is formed on a substrate before the p-doped semiconductor material layer, it is advantageous for the concentration of the electrically active n-type dopant to be decreasing from the substrate to the p-doped semiconductor material layer. The band gap width in the n-doped semi-conductor material layer also decreases from the interface with the substrate to the p-doped semiconductor material layer.

When the p-doped semiconductor material layer is formed on a substrate before the n-doped semiconductor material layer, it is advantageous for the concentration of the electrically active p-type dopants to be decreasing from the substrate to the n-doped semiconductor material layer. The band gap width in the p-doped semiconductor material layer also decreases from the interface with the substrate.

It is particularly advantageous for the concentration of the n-type or p-type dopants to be continuously decreasing or to possibly present one or more plateaus in the concentration of the n-type or p-type dopants. In an advantageous embodiment, the concentration of n-type or p-type electrical dopants decreases strictly from the interface with the substrate before becoming constant or substantially constant in the adjacent portion of the p-type or n-type doped layer to form the pn or pin junction.

Achieving such a concentration gradient by means of a liquid phase epitaxy operation is particularly complex as it is necessary to provide several growth baths having different dopant concentrations and different concentrations of the main constituents. The baths follow one another to form successive layers having different compositions forming the gradient. Furthermore, to facilitate formation of an interface having a good crystallographic quality, it is common practice to melt a part of the top layer of the substrate. Formation of successive layers at high temperature results in a total or partial dissolution of the previously formed layers so that the final concentration profile deviates notably from the initially required profile. This drawback limits the advantages of a succession of epitaxies performed in liquid phase using several successive baths. The problem can be all the more critical as the gradient is made over a small thickness.

Growth of a HgCdTe layer on a CdTe substrate by liquid phase epitaxy is known. The teaching of the document U.S. Pat. No. 4,376,663 can be cited that presents liquid phase epitaxial growth of a HgCdTe layer on a CdTe substrate followed by growth of a CdTe layer on the HgCdTe layer.

To make the n-type or p-type electrical doping gradient easier to achieve, it is proposed to use diffusion phenomena of the substrate atoms in a liquid phase epitaxy step. The atoms are subjected to the same thermal budget during the liquid phase epitaxy step thereby making it possible to better correlate the doping profiles of the constituents in the HgCdTe alloys and the profile of an n-type or p-type electrical dopant from the interface with the substrate. In preferential manner, the liquid phase epitaxy is performed with an oversaturation of tellurium in order to form a layer rich in tellurium.

As illustrated in FIG. 1, a substrate 1 is provided having at least a top layer 2 formed from a first semiconductor material. The top layer 2 of first semiconductor material is chosen from CdTe and CdZnTe. The thickness of the top layer 2 is advantageously greater than 500 nm and more preferentially less than 2 microns when it is different from the substrate. The first semiconductor material has a first cadmium concentration. In an advantageous configuration, the cadmium represents at least 30% atomic of the top layer 2, more advantageously at least 40% atomic and even more advantageously at least 45% atomic in the material of CdZnTe type. Preferentially, the material of CdZnTe type has a Tellurium content equal to 50% atomic, a Cadmium content greater than or equal to 45% and a Zinc content less than or equal to 5%.

The top layer 2 has a first electrical dopant. The first electrical dopant can be an n-type dopant for example chlorine, iodine and indium or a p-type dopant for example lithium, sodium, potassium, copper, silver and gold. The top layer 2 can have a single n-type or p-type electrical dopant or several different electrical dopants in order to take advantage of different rates of diffusion. When the top layer 2 participates in the flow of an electrical current in the finalised diode, the first electrical dopant is an electrically active dopant of the top layer 2 and at least a part of the first electrical dopant is located in substitutional position.

Before the liquid phase epitaxy step, introduction of the first electrical dopant in the top layer 2 can be performed by an implantation step advantageously followed by a recrystallization anneal of the surface of the substrate 1 to promote formation of a good crystallographic quality seed for subsequent growth of a good quality monocrystalline first layer 3. The recrystallization anneal is advantageously performed at a temperature greater than or equal to 400° C. It is also possible to perform doping of first layer 2 by means of an anneal of the substrate 1 with an atmosphere containing a precursor of the first electrical dopant. It is further possible to dope the top layer 2 when formation takes place, for example by crystal growth, and more particularly when drawing an ingot that is subsequently sliced to form the substrate 1.

During the formation step of the first layer 3 by liquid phase epitaxy, a part of the cadmium content and of the first electrical dopant content will migrate from the top layer 2 to the first layer 3. The first layer 3 is made from a semiconductor material that is a ternary or at least ternary, for example quaternary, alloy of which cadmium is one of the main constituents.

In one embodiment, the top layer 2 corresponds to a top area of the substrate 1, i.e. the top layer 2 is formed from the same semiconductor material as the substrate 1 and with the same cadmium concentration. In an alternative embodiment, the top layer 2 has a cadmium concentration that is higher than that of the substrate 1 or possibly lower than that of the substrate 1 to better control the cadmium profile in the first layer 3 during epitaxy. It is also possible to provide for the concentration of the first electrical dopant to be identical between the substrate and the top layer 2.

Figure 2:
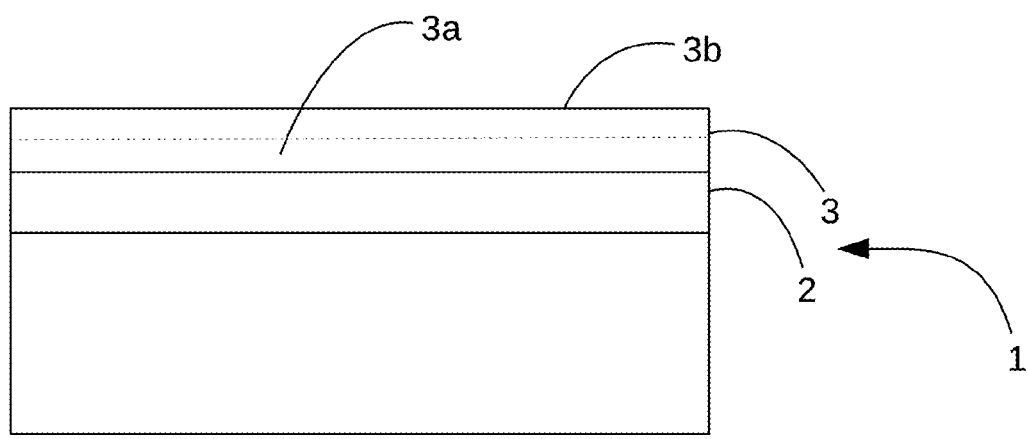
FIG. 2 schematically represents a second step of a method for fabricating a photodiode structure according to the invention, in cross-section.

As illustrated in FIG. 2, a first layer 3 of second semiconductor material is grown by liquid phase epitaxy from the top layer 2 of first semiconductor material. The first layer 3 has an interface with the top layer 2. The thickness of the first layer 3 is preferentially more than 500 nm and advantageously less than 6 microns. Even more preferentially, the thickness is more than 1 micron and advantageously less than or equal to 6 microns or even 5 microns. The thickness of the first layer 3 is preferentially more than 3 microns so that the final structure has an absorbent area extending over at least 2 microns The second semiconductor material is an alloy that contains at least Hg, Cd and Te. The semiconductor material formed is monocrystalline and can be represented by the formula $Hg_{1-x}Cd_xTe$ or more generally HgCdTe. The second semiconductor material can be an at least quaternary derivative of HgCdTe, for example $Hg_{1-x-y}Cd_xZn_yTe$, $Hg_{1-x-y}Cd_xMn_yTe$ or $Hg_{1-x}Cd_xTe_{1-z}Se_z$. In general manner, the second semiconductor material is a material having a band gap energy value that varies at least with the cadmium concentration. The first semi-conductor material is different from the second semiconductor material while allowing an adjustment of the lattice parameter to perform monocrystalline growth of the first layer 3 from the surface of the top layer 2.

The liquid phase epitaxy step uses a single bath containing all the elements involved in forming the second semiconductor material with Hg, Cd, Te and possibly Zn, Mn and Se or other necessary materials. The bath can also contain at least one electrical dopant so as to electrically dope the first layer 3 of second semiconductor material. The at least one electrical dopant can be the first electrical dopant and/or a second electrical dopant of the same conductivity type. The bath is not modified during growth, for example no constituents are added thereto.

The material forming the first layer 3 is chosen so as to allow formation of a monocrystalline first layer 3 of second semiconductor material by liquid phase epitaxy. The bath has a cadmium concentration that is lower than the cadmium concentration of the top layer 2. If the bath contains an electrical dopant, its concentration is lower than the concentration of the first electrical dopant in the top layer 2.

When liquid phase epitaxy growth takes place, the at least one electrical dopant and the cadmium diffuse from the top layer 2 to the first layer 3 of second semiconductor material.

Growth from the top layer 2 generates a cadmium concentration gradient from the interface with the top layer 2 which generates a band gap width gradient in the first layer 3 that decreases from the interface with the top layer 2, away from the interface. The minimum cadmium concentration in the first layer 3, i.e. the bottom part of the gradient and/or the constant part, is comprised between 10% and 25% atomic to obtain a good absorption of the infrared radiation sought for. It is also preferable for the cadmium gradient to represent a difference of concentration at least equal to 10% atomic or at least equal to 25% atomic to dissociate the electro-optical behaviours properly.

As the growth progresses, it is increasingly difficult for the cadmium present in the top layer 2 to move as it has to diffuse over a larger distance and it consumes itself. A balance is created between the cadmium present in the bath and the cadmium originating form the top layer 2. The cadmium concentration on the growth front of the first layer 3 decreases until the cadmium concentration finally reaches the value defined by the bath and the cadmium concentration becomes constant or almost constant, for example with a gradient of less than 1%. What is meant by constant cadmium concentration is a concentration having a variation of less than 1% atomic over 50 nm.

The growth conditions of the first layer 3 are preferentially chosen to form a first layer 3 having a constant cadmium concentration over at least 100 nm, advantageously over least 500 nm or 1 micron or 2 microns. It is also advantageous for the constant cadmium concentration to be located at a distance comprised between 500 nm and 1.5 microns from the interface.

At the same time, an electrical dopant concentration gradient forms in the first layer 3. The electrical dopant is mainly or almost exclusively located in substitutional position. The electrical dopant concentration gradient is not linked to a modification of the constituents in the growth bath but to the progression of the incorporation/diffusion of the first electrical dopant in the crystal lattice from the top layer 2, and possibly from the bath, and to a possible incorporation of a second electrical dopant. Preferentially, the electrical dopant concentration gradient extends over at least 500 nm even more preferentially between 500 nm and 1.5 microns. It is also preferable for the gradient to extend until the first electrical dopant concentration is less than $2*10^{15}$ at/cm$^3$.

In a particular case, the electrical dopant is indium and the concentration of the electrical dopant decreases from the interface between the top layer 2 and the first layer 3. In another particular case, the electrical dopant is iodine and a first electrical dopant peak is present at the interface or very close to the interface so that a slight increase of the concentration can exist followed by a decrease over the rest of the first layer 3.

In a preferential embodiment, the electrical dopant concentration in the bath is zero. In advantageous manner, the growth conditions are chosen such that the concentration of first electrical dopant in the bath defines the minimum required concentration in the first layer 3, for example a concentration less than or equal to $2*10^{15}$ cm$^{-3}$. When growth of the first layer 3 occurs, the electrical dopant concentration decreases and can then be constant at the value defined by the bath. What is meant by constant electrical dopant concentration is a concentration having a relative variation of less than 10% over 50 nm.

Advantageously, growth of the first layer 3 is performed until the first layer 3 presents at least a constant cadmium concentration over at least 500 nm and an electrical dopant concentration that varies by less than 10% over at least 50 nm. If the bath does not contain any first electrical dopant, growth is preferentially performed until the first layer 3 is unintentionally doped and the cadmium concentration is constant. Preferably, the first layer 3 is made until the first layer 3 presents at least a constant cadmium concentration over at least 2 microns.

The temperature of the liquid phase epitaxy step is higher than a threshold temperature that ensures diffusion of the cadmium and of the first electrical dopant. The thermal budget (time-temperature couple) of the liquid phase epitaxy step is lower than the threshold thermal budget that performs homogenization of the cadmium and/or of the first electrical dopant over the thickness of the first layer 3. If the temperature is too low, the cadmium and first dopant cannot diffuse and form the required decreasing profile. On the contrary, if the thermal budget is too high, the cadmium and/or first electrical dopant diffuse too much and the concentration becomes homogeneous over the thickness of deposited the first layer 3. The liquid phase epitaxy temperature can be comprised between 400° C. and 500° C.

In a different technical field, it is known from the document U.S. Pat. No. 5,861,321 to grow a layer of HgCdTe on a CdTe or CdZnTe substrate by liquid phase epitaxy. The thickness of HgCdTe layer is at least 30 microns. The substrate is n-type or p-type doped and the HgCdTe layer is formed undoped. Annealing is then performed so as to form a homogeneous doping in the HgCdTe layer. In another embodiment, substrate is doped from the dopants present in the substrate. Homogenization annealing is performed during growth.

The growth step of the first layer 3 by liquid phase epitaxy is configured so that the thickness of the first layer 3 is advantageously less than 5 microns, preferably less than 4 microns. The growth step of the first layer 3 by liquid phase epitaxy is configured so that the thickness of the first layer 3 is advantageously more than 1 micron, preferably more than 2 microns. By forming a first layer 3 of reduced thickness, the thermal budget when growth takes place is reduced thereby limiting the diffusion phenomena that tend towards homogenization of the concentrations.

It is particularly advantageous to form a first layer 3 in which the extent of the cadmium gradient is less than 2 microns or even 1.5 microns, the extent of the gradient in the first layer 3 being measured from the interface with the top layer up to the portion where the concentration of the first element becomes constant.

In advantageous manner, the extent of the cadmium gradient is less than 1.5 microns and even more preferentially less than 1 micron. It is particularly advantageous to form a first layer 3 in which the extent of the cadmium gradient is greater than 100 nm and preferentially greater than 500 nm.

In an advantageous embodiment, the first layer 3 has a minimum cadmium concentration, i.e. the less rich part of the first gradient, that is at least equal to 10% atomic, and preferentially less than or equal to 30% atomic or 20% atomic.

As the first electrical dopant and the cadmium penetrate into the first layer 3 by diffusion, it is possible to have similar and well-controlled doping profiles for the cadmium and the first electrical dopant. What is meant by similar is that the shapes of the profiles are close to one another while at the same time corresponding to very different concentration levels when their concentration profiles are observed on a semi-logarithmic scale. The extents of the first concentration gradient and of the second concentration gradient are preferentially identical or present a difference of less than 1 micron or even in less than 500 nm over the thickness.

In advantageous manner, before the liquid phase epitaxy step, the top layer 2 has a concentration of the first electrical dopant that is greater than or equal to $5*10^{16}$ at/cm$^3$, advantageously greater than or equal to $5*10^{17}$ at/cm$^3$, or even greater than $5*10^{18}$ at/cm$^3$ or $1*10^{19}$ at/cm$^3$. The concentration is preferentially comprised between $5*10^{15}$ and $1*10^{19}$ at/cm$^3$.

It is particularly advantageous to choose a concentration of the first electrical dopant in the top layer 2, for example made from indium or iodine, that ensures an incorporation of the active electrically dopant at least equal to $5*10^{18}$ at/cm$^3$ and preferentially at least equal to $1*10^{19}$ at/cm$^3$ in the first layer 3.

In preferred manner, the second electrical dopant concentration gradient presents a concentration ratio at least equal to 10, or at least equal to 50, or at least equal to 100 or even 1,000 between its highest concentration and its lowest concentration. Such a profile is obtained in a single liquid phase epitaxy operation with a single bath.

The concentration of first electrical dopant in the top layer 2, of dopants in the liquid bath and the operating conditions of the liquid phase epitaxy step define the doping profile in the first layer 3.

It is advantageous to choose growth operating conditions for which the first layer 3 reaches a constant cadmium concentration before reaching a constant electrical dopant concentration. The minimum concentration of first electrical dopant is only present in the portion of the first layer 3 of constant or almost constant cadmium content and is preferentially comprised between $5*10^{13}$ at/cm$^3$ and $2*10^{15}$ at/cm$^3$.

In the growth bath, it is particularly advantageous to choose a concentration that ensures incorporation of electrically active dopants, of n type or p type, of less than $5*10^{15}$ at/cm$^3$ in the constant or almost constant portion of the first layer 3, preferentially less than $2*10^{15}$ at/cm$^3$ and even more preferentially less than $5*10^{14}$ at/cm$^3$.

In preferential manner, the first layer 3 comprises a concentration of electrically active dopants with a concentration gradient that decreases strictly from a first dopant concentration at least equal to $1*10^{18}$ or $5*10^{18}$ at/cm$^3$ to a concentration of less than $2*10^{15}$ at/cm$^3$, preferentially from a value at least equal to $4*10^{18}$ at/cm$^3$ to a value of less than $8*10^{14}$ at/cm$^3$. The use of a doping gradient that achieves a weak doping in the absorbent area or even tends to a level that corresponds to depletion in the layer enables the electric charge carriers to be guided more efficiently. Such a configuration reduces crosstalk and improves the Modulation Transfer Function (MTF).

During the liquid phase epitaxy step, the cadmium concentration is modified which causes a variation of the band gap width of the deposited material. At the same time, the concentration of first electrical dopant changes and tends to decrease. The characteristics of the two concentration gradients are not defined by multiple growth baths but by the cadmium concentrations and the concentration of the first electrical dopants in the top layer and in the bath in relation with the thermal budget of the liquid phase epitaxy step. The two concentration gradients can be defined by running one or more prior simulations. The simulations take account of the cadmium diffusion coefficient, the first electrical dopant diffusion coefficient, the respective concentrations in the bath and in the top layer 2 and the depletion of these two constituents as growth progresses.

Modulation of the cadmium concentration representing modulation of the band gap width and modulation of the electrical dopant enables several distinct portions of the first layer 3 to be functionalized in a single step to transform an electromagnetic signal into an electrical signal and to promote conduction of this electrical signal.

The first layer 3 has a first portion 3a designed to facilitate transit of an electrical signal and a second portion 3b designed to capture only or mainly the electromagnetic signal at least over a part of its thickness.

By forming a first portion 3a of the second semiconductor material that is richer in first electrical dopant and globally richer in cadmium, it is possible to form a weakly resistive layer with a wide band gap thereby ensuring a good transfer of the electrical signal. First portion 3a is less electro-optically active thereby reducing the impact of crystal defects on the quality of the signal provided by the photodiode.

Second portion 3b forms the absorbent part of the photodiode structure, i.e. the portion designed to capture the electromagnetic radiation. Second portion 3b presents a lower band gap width than the threshold value to collect the required electromagnetic radiation. Second portion 3b presents a smaller band gap width and is weakly doped or undoped to provide the photodetector with good optoelectronic performances. The use of a weak doping makes it possible to reduce the value of the dark current that is a parameter that impairs the performances of the photodetector thus facilitating the use of a thicker absorbent layer.

Second portion 3b preferentially presents a cadmium concentration lower than the threshold value equal to 25% atomic and even more preferentially a constant cadmium concentration. Second portion 3b preferentially presents a thickness comprised between 1 and 4.5 microns and even more preferentially comprised between 1.5 and 4 microns or even between 2 and 4 microns. The thickness of the second portion can be chosen according to the mode of formation of the second layer 4 designed to finalise the junction. The use of an absorbent layer of more than 1 micron preferentially more than 1.5 microns enables a better quantum efficiency to be achieved thereby facilitating its use in the imaging field. Advantageously, second portion 3b has a concentration of the first electrical dopant of less than $2*10^{15}$ at/cm$^3$. For example, second portion 3b of the first layer 3 made from second semiconductor material contains or is exclusively formed by the portion having a constant or almost constant cadmium concentration and forms the most optically active n-type or p-type doped layer.

First portion 3a preferentially presents a cadmium concentration the minimum value which corresponds to the maximum value of second portion 3b. First portion 3a preferentially presents a cadmium concentration the maximum value of which is at least equal to 30% atomic, advantageously at least 40% atomic or 50% atomic. Advantageously, second portion 3b has a concentration of the first electrical dopant of more than $2*10^{15}$ at/cm$^3$. First portion 3a can have an area where the cadmium concentration is constant. First portion 3a preferentially presents a thickness comprised between 1 and 4 microns and even more preferentially comprised between 2 and 4 microns.

The existence of the first electrical dopant concentration gradient ensures the formation of an electrical field or pseudo-field in the first layer 3 thereby enabling the photo-generated charge carriers to be channeled from first portion 3a to second portion 3b that is weakly resistive and that is able to perform an efficient transfer of the signal. There is no growth interface between second portion 3b and first portion 3a thereby ensuring a good signal transit.

In advantageous manner, the top layer 2 and possibly the bath only comprise the first electrical dopant or the first electrical dopant represents the majority thereof. If the conditions of the liquid phase epitaxy step and the concentration of first electrical dopant do not enable the first electrical dopant concentration profile to match the cadmium concentration profile, it is advantageous to dope the top layer 2 with a second electrical dopant of the same type of conductivity as the first electrical dopant. The second electrical dopant is chosen so as to present a different rate of diffusion from the first electrical dopant during formation of the first layer 3. For example, for an n-type doping, it is possible to use iodine in association with indium in order to match the electrical doping profile with the band gap width profile defined by the cadmium.

Modification of the first dopant content is performed continuously over the thickness of the first layer 3 which makes it easier to achieve a continuous modification of the concentration the n or p type electrically active dopants and therefore the appearance of an electrical field enabling the photogenerated charge carriers to be channeled efficiently.

Figure 3:
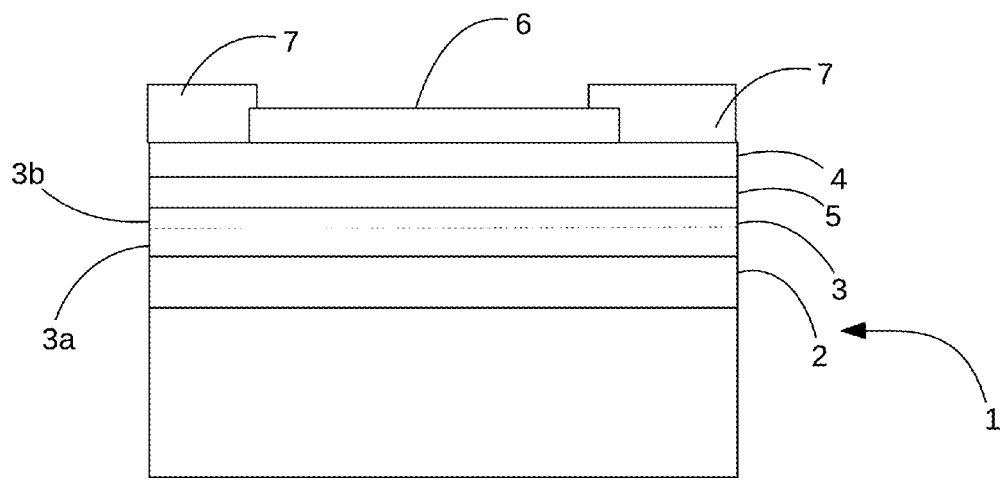
FIG. 3 schematically represents a third step of a method for fabricating a photodiode structure according to the invention, in cross-section.

As illustrated in FIG. 3, once the first layer 3 of first semiconductor material has been formed, the rest of the photodiode can be formed and in particular the second layer 4 of opposite conductivity to define the pn or pin junction. When the first layer 3 is n-doped, the second layer 4 is p-doped. On the contrary, when the first layer 3 is p-doped, the second layer 4 is n-doped. As indicated in the foregoing, one or more other layers can be deposited before the second layer 4 to form a pin junction. It is also possible to form an unintentionally doped third layer 5 that separates the p-doped and n-doped layers defining the junction. The layer 5 can be formed by one or more different materials.

The second layer 4 is made from a third semiconductor material that has a smaller band gap width than the threshold value. The active or most active optical part of the photodiode is formed by materials whose band gap width is smaller than the threshold value so that the photodiode is sensitive to a particular range of electromagnetic radiation distinct from that of first portion 3a. This electromagnetic radiation is not collected by first portion 3a of first layer 2 that has a larger band gap width. The third semiconductor material is advantageously a ternary or at least ternary alloy that is preferentially HgCdTe or HgCdTe-based. In advantageous manner, the total thickness of the first layer 3 and the second layer 4 is less than or equal to 6 microns or even in less than or equal to 5 microns.

For example, the second layer 4 made from third semiconductor material is deposited by epitaxy, advantageously by liquid phase epitaxy, by molecular beam epitaxy (MBE) or by metalorganic chemical vapor deposition (MOCVD).

In an alternative embodiment, the second layer 4 designed to form the pn junction is obtained by implantation of a dopant of opposite electrical conductivity or by diffusion using an atmosphere containing a precursor of the dopant. The third semiconductor material can be identical to the second semiconductor material. The second layer 4 is formed in the first layer 3 by extrinsic doping. The thickness of the junction formed by layers 3 and 4 corresponds to the initial thickness of the first layer 3 formed by liquid phase epitaxy.

The total thickness of the first layer 3 and the second layer 4 is advantageously less than 5 microns. The thickness of the first layer 3 is adjusted depending on whether the second layer is deposited on the first layer 3 or formed in the first layer 3. In a particular embodiment, the thickness of the first layer 3 is greater than or equal to 3 microns and preferentially less than or equal to 5 microns, after formation of the second layer 4.

The first cadmium concentration gradient and the second gradient of first electrical dopant are preserved in the first layer 3 when formation of the second layer 4 takes place.

In preferential manner, absorption of the electromagnetic radiation within the photodiode takes place mainly in second portion 3b of the first layer 3. The thickness of second portion 3b of the first layer 3 is greater than the thickness of the second layer 4 of third semiconductor material when the second layer is formed in the first layer so as to preserve an area having good electro-optical properties.

It is particularly advantageous to form an electrically conductive contact 6 on the second layer 4 or at least in electrical contact with the second layer 4. The electrically conductive contact 6 can be formed by a contact layer advantageously made from pure metallic material or from a metal alloy. The contact layer can be deposited and then etched to define the contact 6. When several photodiodes are formed on the same substrate 1, a specific contact is formed on each photodiode. The first cadmium concentration gradient and the second gradient of first electrical dopant are preserved in the first layer 3 when formation of the contact or contacts 6 takes place.

The photodiode is advantageously partially covered by a covering layer 7, for example made from silicon nitride Si3N4 or a silicon oxide SiOx or a layer of ZnS to protect the photodiode from the outside environment, for example from moisture. The first cadmium concentration gradient and the second gradient of first electrical dopant are preserved in the first layer 3 when formation of the covering layer 7 takes place.

Growth of the first layer 3, of the second layer 4 and of the third layer 5 if present is advantageously performed in such a way as to form more than one photodiode. It is advantageous to form a plurality of photodiodes in the form of a photodiode array.

The electrically conductive contact 6 is designed to be connected to a readout circuit that will apply the bias to the photodiode and will receive the electrical signal representative of the observed scene. It is advantageous to associate each photodiode with a readout circuit. The plurality of readout circuits is also connected as a readout circuit array so that the plurality of readout circuits are hybridized to the plurality of photodiodes to form a focal plane array (FPA).

It is particularly advantageous to make the photodiode operate at low temperature, preferably at a temperature of less than 0° C. and more preferentially in the 130K-250K range.

It is conceivable to eliminate the substrate 1 after the photodiode has been formed, for example after the electrically conductive contact 6 has been formed or after deposition of the covering layer 7 or after hybridization to the readout circuit. As an alternative, the substrate 1 can be thinned or kept with its initial thickness. The electromagnetic radiation enters the photodiode structure via the substrate 1.

A photodiode structure is proposed comprising a junction formed from a first layer 3 doped with n-type conductivity and a second layer 4 doped with p-type conductivity. The first layer is made from a first semiconductor material and defines a highly doped first portion 3a and a weakly doped second portion 3b.

The photodiode structure successively comprises a first portion of first layer made from a first semiconductor material, a second portion of first layer made from the first semiconductor material and a second layer made from second semiconductor material. First and second layers 3 and 4 form the junction that performs transformation of the electromagnetic signal into electron-hole pairs.

When the second layer 4 is formed by implantation of a dopant of second conductivity type in the first layer 3 to form the junction, the same semiconductor material is present on each side of the junction, except for the type of doping.

A photodiode is obtained having a first layer 3 made from HgCdTe or one of its at least quaternary derivatives. The first layer 3 comprises a first cadmium concentration gradient and a second concentration gradient of first electrical dopant. The first concentration gradient and second concentration gradient are both decreasing from one end of the first layer 3. The end can be uncovered or coated by a material having predefined optical properties when the substrate 1 and the top layer 2 have been removed. Depending on the configurations, the substrate 1 is at least partially removed after formation of an electrically conductive contact 6 on the second layer 4 or the substrate 1 is totally removed after formation of an electrically conductive contact 6 on the second layer 4.

The first layer 3 is of a first conductivity type and presents a thickness of less than 6 microns. The second layer 4 is also made from HgCdTe or one of its at least quaternary derivatives. The second layer 4 is a layer of the second conductivity type opposite from the first conductivity type, the first and second layers forming a junction performing transformation of an electromagnetic signal into electron-hole pairs. The second layer 4 has at least the same Hg, Cd and Te composition as the first layer 3 at the interface between the first layer 3 and the second layer 4.

The first layer 3 presents a decreasing cadmium concentration and a decreasing electrically active dopant concentration between first portion 3a and second portion 3b thereby enabling a better quality signal to be provided. The decreasing concentration is without discontinuity.

The precautions taken in the liquid phase epitaxy step to form the concentration gradients are maintained until the end of the method for forming the diode. The method for fabricating the diode does not comprise an anneal homogenizing the cadmium concentration and/or the concentration of the first electrical dopant over the whole thickness of the first layer.

In prior art methods, the electrically active dopant concentration profile is obtained by a multitude of crenels that correspond to as many successive baths. The profile formed by the plurality of crenels is subsequently subjected to annealing designed to make the crenels disappear. As the rate of diffusion of cadmium is different from the rate of diffusion of the n-type electrically active dopant, it is particularly difficult to obtain an identical profile to that obtained with the method described in the foregoing. As doping is obtained when growth by liquid phase epitaxy takes place, the doping method generates considerably less defects than an implantation step in particular in the weakly doped area which will be electro-optically active.

The photodiode structure enables the photogenerated charge carrier to be better controlled which enables for example the blur of the obtained image to be reduced when several photodiodes are connected to form an array.

The invention claimed is:

1. Photodiode structure comprising a junction designed to transform an infrared electromagnetic radiation into electron-hole pairs, the junction comprising a first layer made from HgCdTe or one of its at least quaternary derivatives of a first conductivity type and a second layer made from HgCdTe or one of its at least quaternary derivatives of a second conductivity type opposite from the first conductivity type to form a p-n or p-i-n junction;
   wherein the first layer comprises:
      first and second ends, the first end being separated from the second layer by the second end;
      a first cadmium concentration gradient that is decreasing from the first end of the first layer in the direction of the second layer, a minimum value of the atomic cadmium concentration in the first cadmium concentration gradient being comprised between 10% and 25% atomic, the first cadmium concentration gradient defining a first portion and a second portion, the second portion having a smaller band gap width than the first portion;
      a second concentration gradient of at least one electrical dopant, the second concentration gradient being decreasing from the first end in the direction of the second layer;
   wherein the total thickness of the first layer and of the junction layer is less than 6 microns;
      wherein the first cadmium concentration gradient is continuously decreasing in the form of a diffusion profile,
      wherein the second concentration gradient of at least one electrical dopant is continuously decreasing in the form of a diffusion profile,
      wherein the second concentration gradient extends over a distance comprised between 500 nm and 1.5 microns from the first end, in the first layer,
      wherein the second concentration gradient is decreasing from a concentration of more than $5*10^{18}$ at/cm$^3$ to a concentration of less than $2*10^{15}$ at/cm$^3$;
      wherein the first cadmium concentration gradient extends until the first electrical dopant concentration is less than $2*10^{15}$ at/cm$^3$
and wherein first layer presents a larger thickness than the second layer.

2. Photodiode structure according to claim 1 wherein an electrically conductive contact is electrically connected to the second layer, the electrically conductive contact being made from pure metallic material or from an alloy of metallic materials.

3. Photodiode structure according to claim 1 wherein the first layer has a constant cadmium concentration over at least 500 nm.

4. Photodiode structure according to claim 3 wherein the first layer has a constant cadmium concentration over at least one micrometer.

5. Photodiode structure according to claim 1 wherein the first layer presents a portion having a constant cadmium concentration and that is not unintentionally doped.

6. Photodiode structure according to claim 1 wherein the thickness of the first layer is greater than or equal to 3 microns.

7. Photodiode structure according to claim 1 wherein the thickness of the first layer is less than or equal to 5 microns.

8. Photodiode structure according to claim 1 wherein the difference of cadmium concentration in the first cadmium concentration gradient is at least equal to 25% atomic.

9. Photodiode structure according to claim 1 wherein the total thickness of the first layer and of the junction layer is less than 5 microns.

10. Photodiode structure according to claim 1 wherein the second concentration gradient of at least one electrical dopant comprises an iodine concentration gradient and a chlorine concentration gradient.

11. Method for fabricating a photodiode structure according to claim 1 successively comprising:
   providing a substrate having at least a top layer made from CdZnTe or CdTe and having a first concentration of a first electrical dopant of a first conductivity type and a first cadmium concentration, the top layer being of the first conductivity type,
   growing a first layer of HgCdTe or one of its at least quaternary derivatives from the top layer by liquid phase epitaxy using a single bath containing a precursors of the first layer including cadmium and possibly at least one electrical dopant, the bath having a lower second cadmium concentration than the first cadmium concentration and possibly a lower second concentration of electrical dopant than the first concentration of first electrical dopant, the at least one electrical dopant being chosen from the first electrical dopant and/or a second electrical dopant, the liquid phase epitaxy being performed at a temperature achieving diffusion of a part of the cadmium atoms and of the first electrical dopant from the top layer to the first layer to form a continuously decreasing first cadmium concentration gradient from the interface between the top layer and the first layer when moving away from the interface, the minimum atomic cadmium concentration value in the first concentration gradient being comprised between 10% and 25% atomic, the first concentration gradient defining a first portion and a second portion, the second portion having a smaller band gap width than the first portion, and to form a second concentration gradient of the at least one electrical dopant in the first layer, the second concentration gradient of at least one electrical dopant being continuously decreasing from a concentration of more $5*10^{18}$ at/cm$^3$ to a concentration of less than $2*10^{15}$ at/cm$^3$, the second concentration gradient extending in the first layer over a distance comprised between 500 nm and 1.5 microns from the interface with the top layer, the first layer being of the first conductivity type, the first concentration gradient extending until the concentration of first electrical dopant is less than $2*10^{15}$ at/cm$^3$,
   forming at least a junction layer made from HgCdTe or one of its at least quaternary derivatives of a second conductivity type opposite from the first conductivity type to form a p-n or p-i-n junction with the first layer, the first cadmium concentration gradient and the second concentration gradient of first electrical dopant being preserved in the first layer after formation of the junction layer, the second concentration gradient being decreasing from the interface between the top layer and the first layer in the direction of the second layer, the first layer presenting a greater thickness than the second layer, the total thickness of the first layer and of the junction layer being less than 6 microns.

* * * * *